United States Patent [19]

Narita et al.

[11] Patent Number: 5,274,485
[45] Date of Patent: Dec. 28, 1993

[54] LIQUID CRYSTAL DISPLAY

[75] Inventors: Kenichi Narita; Takao Yamauchi; Shoji Nakanishi; Hiroshi Inamura; Makoto Murakami, all of Tottori, Japan

[73] Assignees: Sanyo Electric Co., Ltd., Osaka; Tottori Sanyo Electric Co., Ltd., Tottori, both of Japan

[21] Appl. No.: 891,849

[22] Filed: Jun. 1, 1992

[30] Foreign Application Priority Data

Jun. 24, 1991 [JP] Japan .................. 3-151973
Sep. 19, 1991 [JP] Japan .................. 3-239826

[51] Int. Cl.⁵ .............. G02F 1/1343; H01L 27/02; H01L 29/46; H01L 29/88
[52] U.S. Cl. ........................... 359/58; 359/60; 257/72; 257/30; 257/761
[58] Field of Search .............. 359/54, 58, 60, 87, 359/56, 57; 257/30, 72, 761

[56] References Cited

U.S. PATENT DOCUMENTS

| 4,413,883 | 11/1983 | Baraff et al. |
|---|---|---|
| 4,523,811 | 6/1985 | Ota .................. 359/58 |
| 4,534,623 | 8/1985 | Araki . |
| 4,685,771 | 8/1987 | West et al. ........... 359/51 X |
| 5,122,889 | 6/1992 | Kaneko et al. ........ 359/60 |
| 5,128,784 | 7/1992 | Suzuki et al. ........ 359/58 |
| 5,187,602 | 2/1993 | Ikeda et al. ......... 359/59 |

FOREIGN PATENT DOCUMENTS 0440144 7/1991 European Pat. Off. .

Primary Examiner—William L. Sikes
Assistant Examiner—Kenneth Parker
Attorney, Agent, or Firm—Darby & Darby

[57] ABSTRACT

A liquid crystal display includes an insulating substrate, a first metal layer formed on the substrate, a first insulating layer including an oxide of tantalum nitride with high ratio of nitrization formed on the first metal layer, a second insulating layer including an oxide of tantalum nitride with low ratio of nitrization formed on the first insulating layer, and a second metal layer formed on the second insulating layer.

19 Claims, 4 Drawing Sheets

LIQUID CRYSTAL DISPLAY

BACKGROUND OF THE INVENTION

1. Field of the Invention

The present invention relates to a liquid crystal display and, more specifically, to an improvement of a liquid crystal display including non-linear MIM (Metal-Insulator-Metal) elements between pixel electrodes and signal lines.

2. Description of the Background Art

Recently, non-linear MIM elements which can be fabricated relatively easily are used in liquid crystal display for high multiplexing matrix drive (highly time-sharing matrix addressing) of liquid crystal display cells.

FIG. 5 is a cross section showing one example of the conventional MIM element. In this figure, a signal line 112 of tantalum or aluminum is formed on a transparent insulating substrate 111 formed of, for example, glass. A portion 121 of signal line 112 is also used as a first metal layer of the MIM element. Signal line 112 is covered with an insulating layer 122 formed of a metal oxide such as tantalum oxide or alumina. A portion of the insulating layer 122 is further covered with a second metal layer 123 of the MIM element. The second metal layer 123 can be formed of chromium or aluminum. In other words, the MIM element is comprised of the first metal layer 121, the insulating layer 122 and the second metal layer 123. The second metal layer 123 is extended to a pixel electrode 113 formed on the substrate 111 to be connected thereto.

The insulating layer 122 can be formed relatively easily by oxidizing the surface of signal line 112. However, the current-voltage (I-V) characteristic of the MIM element including the insulating layer 122 formed in that manner does not easily match the high multiplexing drive characteristic of the liquid crystal display cell.

When a liquid crystal cell is driven in high multiplexing manner, a certain AC OFF voltage is applied to the signal line even when it is not selected. In this case, it is desirable that the high ON voltage applied to the signal line surely aligns the liquid crystal molecules in the direction of the electric field. When the low OFF voltage is being applied to the signal line, the effective voltage applied to the liquid crystal should be as small as possible. However, it is difficult to make the OFF current flowing through the liquid crystal during the OFF voltage period sufficiently small, by controlling the degree of oxidation of the surface of the first metal layer and by controlling the density of the oxide film formed by such oxidation in the MIM element.

If the current flowing through the liquid crystal is not sufficiently small with the OFF voltage of about 4 V, for example, high ripples may appear in the effective voltage applied to the liquid crystal during the OFF voltage period, which ripples may possibly cause erroneous display. Charges stored by the ON voltage in a selected pixel during one scan cycle disappear too fast in the OFF voltage period, and the after image cannot be maintained till the next scan cycle, resulting in flickers on the display. It may be the reason why the OFF current cannot be made sufficiently small when the low OFF voltage is applied, that the energy barrier of the insulating film formed of, e.g., tantalum oxide, is made lower to provide a low resistance value of the MIM element with respect to a high voltage in order to align surely the liquid crystal molecules in the direction of the electric field when the ON voltage is applied, while such MIM element cannot exhibit sufficiently high resistance against the low OFF voltage.

More specifically, the MIM element used for driving the liquid crystal display cell in a high multiplexed manner must have a steep I-V characteristic.

The I-V characteristic of an MIM element is given by:

$$I = KV \exp(\beta \sqrt{V}) \quad (1)$$

where I is current, V is voltage, and K and $\beta$ are represented by:

$$K = ne\mu \cdot \frac{S}{t} \exp\left(\frac{-\phi}{\kappa T}\right) \quad (2)$$

$$\beta = \frac{1}{\kappa T}\left(\frac{e^3}{\pi \Sigma_0 \Sigma t}\right)^{\frac{1}{2}} \quad (3)$$

In formulas (2) and (3), n is the electron density, e is the charge, $\mu$ is the mobility, S is area, t is the thickness of the insulator film, $\phi$ is the donor level, $\kappa$ is the Bolzmann constant, T is temperature, $\Sigma_0$ is the dielectric constant under vacuum and $\Sigma$ is permitivity of the insulator.

As can be understood from the Pool-Frenkel's formula (1), the I-V characteristic of the MIM element becomes steeper when the value of $\beta$ becomes larger. Also, as can be seen from the formula (3), the value of $\beta$ becomes larger as the insulating layer in the MIM element becomes thinner. However, it is difficult to uniformly form a very thin insulating layer, and if the insulating layer is made too thin, the I-V characteristic of the MIM element tends to vary. When a relatively thick insulating layer having the thickness of 30 nm or more has been used, the value of $\beta$ is about 3.0, which is not sufficiently large. Accordingly, it is difficult to obtain sufficiently high contrast of display in the liquid crystal display.

In addition, the I-V characteristic of the conventional MIM element is assymetrical with respect to the change of polarity of the voltage. Therefore, when the liquid crystal cells are driven by an alternating signal, a direct current component remains in the liquid crystal cells, shortening the life of the liquid crystal display.

It is known in the prior art that a small amount of nitrogen may be contained in the first metal layer of the MIM element. However, nitrogen is contained in the first metal layer in order to reduce the resistance value of the first metal layer which is formed of tantalum, for example, and not to adjust the characteristic of the MIM element suitable for driving the liquid crystal cells.

OBJECTS OF THE INVENTION

In view of the above described prior art, an object of the present invention is to improve display contrast of a liquid crystal display including MIM elements.

Another object of the present invention is to improve life of the liquid crystal display including MIM elements.

A further object of the present invention is to improve MIM elements used for high multiplexed drive of the liquid crystal cells.

SUMMARY OF THE INVENTION

According to one aspect of the present invention, the liquid crystal display includes a first insulating substrate, a plurality of signal lines formed on the first substrate, a plurality of MIM elements connected to the signal lines, pixel electrodes connected to the MIM elements, a first insulating liquid crystal retaining film formed to cover the first electrode, signal lines, MIM elements and the pixel electrodes, a second insulating substrate, a plurality of opposing electrodes facing the pixel electrodes formed on the second substrate, a second insulating liquid crystal retaining film formed to cover the second substrate and the opposing electrodes, and a liquid crystal layer sandwiched between the first and second liquid crystal retaining films, in which the MIM element includes a first metal layer including a part of the signal line, a first insulating layer including an oxide of tantalum nitride with high ratio of nitrization formed on first metal layer, a second insulating layer including an oxide of tantalum nitride with low ratio of nitrization formed on the first insulating layer, and a second metal layer formed on the second insulating layer and electrically connected to the pixel electrode.

According to another aspect of the present invention, the MIM element used in the liquid crystal display includes an insulating substrate, a first metal layer formed on the substrate, a first insulating layer including an oxide of tantalum nitride with high ratio of nitrization formed on the first metal layer, a second insulating layer including an oxide of tantalum nitride with low ratio of nitrization formed on the first insulating layer, and a second metal layer formed on the second insulating layer.

According to a further aspect of the present invention, a method of manufacturing the MIM used in the liquid crystal display includes the steps of forming a first metal layer of tantalum nitride on an insulating substrate, forming a second tantalum nitride on the first layer of tantalum nitride, forming an insulating film by oxidizing the surface layer of the first tantalum nitride layer and the second tantalum nitride layer, and forming a second metal layer on the insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
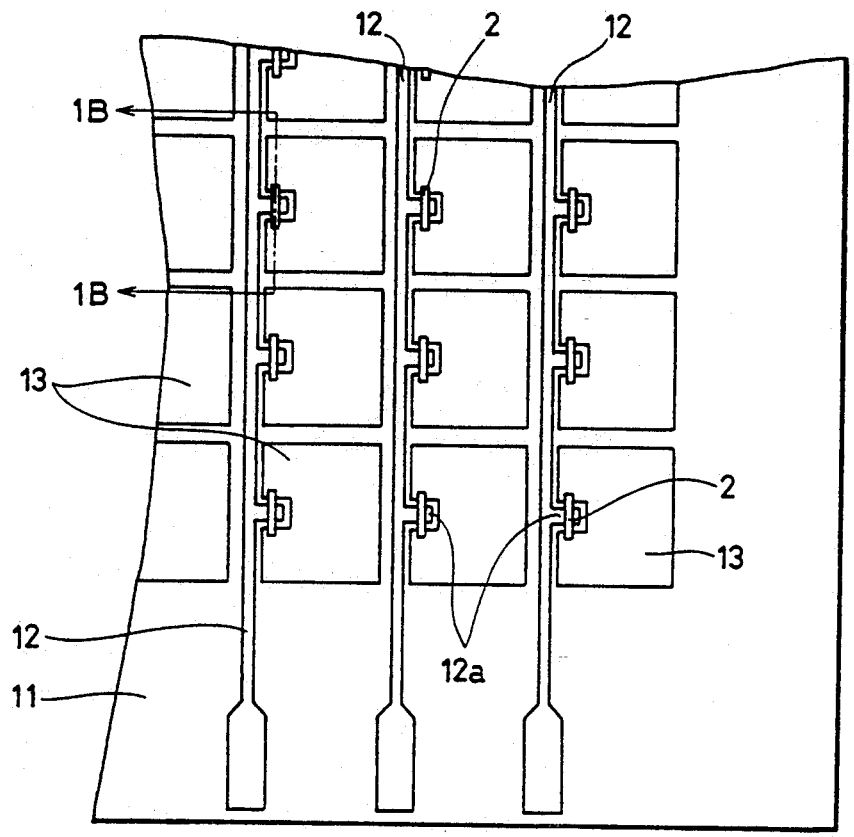
FIG. 1A is a plan view showing a portion of a first substrate used in the liquid crystal display in accordance with one embodiment of the present invention.
Figure 1B:
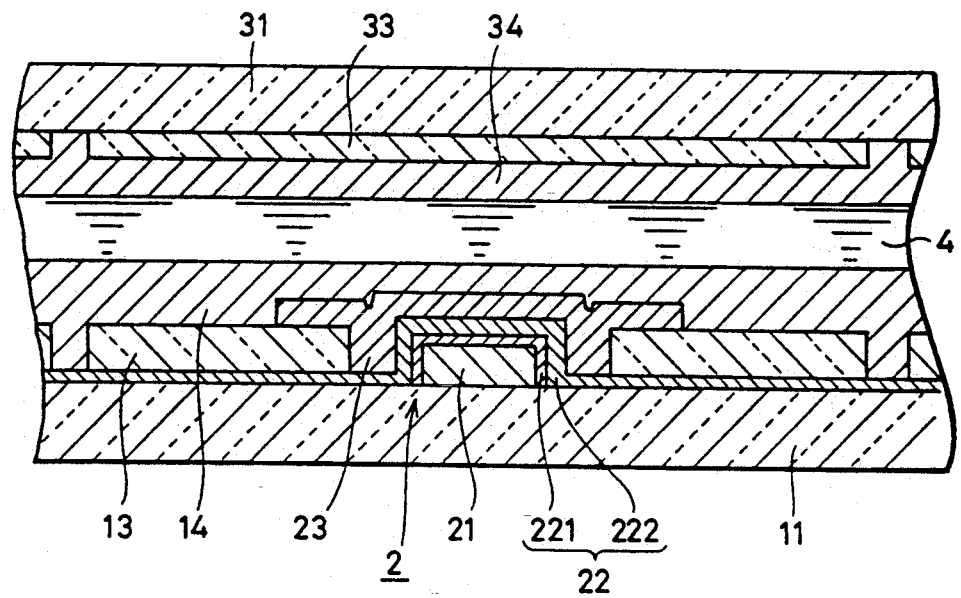
FIG. 1B is an enlarged cross sectional view showing a portion of a liquid crystal display including the substrate of FIG. 1A.

FIGS. 1A and 1B schematically show the liquid crystal display in accordance with one embodiment of the present invention. FIG. 1A shows a first insulating substrate used in the liquid crystal display. FIG. 1B is an enlarged cross section showing a portion of the liquid crystal display assembled by using the substrate of FIG. 1A, and it corresponds to the cross section along the line 1B—1B of FIG. 1A. Referring to these figures, a glass plate, a surface processed plastic plate, a metal plate coated by an insulating film, or a ceramic plate may be used as the first and second insulating substrates 11 and 31. An underlayer (not shown) such as flattening film, or a surface protective film (not shown) such as an etching protective film may be formed on these insulating substrates 11 and 31.

On the first substrate 11, there are provided: a plurality of signal lines 12 arranged parallel to each other and spaced apart by a uniform distance; pixel electrodes 13 connected to the signal lines 12 through non-linear MIM elements 2; and a first insulating liquid crystal retaining film 14 covering the signal lines 12, MIM elements 2 and the pixel electrode 13. The signal line may be a tantalum nitride (TaN$_y$) line having a thickness of 100 to 500 nm and a width of 3 to 50 μm, for example, and the signal lines may be arranged spaced apart by 100 to 500 μm for each other. The pixel electrode 13 is formed of a transparent electrode of indium oxide, for example, having a size of 0.3 mm×0.3 mm, arranged close along the signal line, and it is connected to the second metal layer 23 of the MIM element 2. When the first substrate 11 is not transparent, of course, the pixel electrode may be formed of an opaque conductive material.

On the second substrate 31, stripe opposing electrode 33 facing the pixel electrode 13, and a second insulating liquid crystal retaining film 34 covering the opposing electrode 33 are provided. If desired, a color filter layer (not shown) can be provided below the opposing electrode 33. When the first and the second liquid crystal retaining films 14 and 34 are used as liquid crystal orientating films, the liquid crystal layer 4 sandwiched between the orientating films may be set at a 90° twist nematic mode, a vertical-horizontal mixed orientation mode or a phase transition mode. If the liquid crystal retaining films 14 and 34 are provided in the form of a three-dimensional mesh, the liquid crystal layer 4 is set to a scattering-transmission mode. In any mode, the liquid crystal layer 4 can be matrix-driven by high voltage multiplexed driving based on a voltage averaging method in which a certain weak alternating electric field is applied even during the OFF period, by providing a high potential difference in the ON period.

The signal line 12 has a plurality of small projections 12a orthogonally crossing the longitudinal direction thereof. The MIM element 2 utilizes the projections 12a of the signal line 12 as the first metal layer 21, and it includes an insulating layer 22 including the surface oxide film thereof, and a second metal layer 23. The first metal layer 21 can be formed of tantalum nitride (TaN$_y$) having the thickness of 100 to 500 nm, for example. The insulating film 22 is formed to be a laminated film having the thickness of about 30 nm including a first insulating layer 221 of tantalum oxide with nitrogen of high concentration (TaO$_x$N$_y$) formed on the surface of the first metal layer 21, and a second insulating layer 222 formed of tantalum oxide including nitrogen of lower concentration than the first insulating layer 221. The second metal layer 23 is formed to cover the upper surface and the side surfaces of the second insulating layer 222, and it is formed, for example, of chromium, copper or aluminum having the width of 3 to 10 μm and the thickness of 10 to 200 nm. At a notch portion at the center of one side of the pixel electrode 13, both ends of the second metal layer 23 are connected to the pixel electrode 13.

In the following the process of manufacturing the liquid crystal display shown in FIGS. 1A and 1B will be briefly described. At first, soda glass or pyrex glass is prepared as the insulating substrate 11, and a thin film of tantalum pentoxide or the like is provided on the entire surface of substrate 11 as a protective film. Insulating substrate 11 is set in a vacuum chamber of about $1 \times 10^{-4}$ to $1 \times 10^{-3}$ Pa. The nitrogen gas of a prescribed flow rate as well as rare gas such as argon are introduced in the vacuum chamber, and by sputtering the tantalum, tantalum nitride layer is deposited on the substrate 11. Thereafter, by patterning the tantalum nitride layer, signal line 12 and projecting portion 12a used as the first metal layer 21 are formed. The signal line 12 has a length a little shorter than one side of the substrate 11 and a width of 3 to 50 μm. The projecting portion 12a serving as the first metal layer 21 of the MIM element 2 has the width of 2 to 10 μm. The flow rate of the nitrogen gas and the like are adjusted so that the ratio of nitrization of the first metal layer 21, that is, the value of y in TaN$_y$ attains 0.7 to 3.0, and the thickness of the first metal layer 21 is set in the range from 100 to 500 nm.

A second tantalum nitride layer having the ratio of nitrization of y=0.1 to 0.4 and the thickness of 5 to 25 nm, for example, is formed on the first metal layer 21 in the similar manner as described above. The first metal layer 21 and the second tantalum nitride layer formed thereon are subjected to a anodization with about 35 V so that the surface of the first metal layer 21 is oxidized, by using, for instance, citric acid solution of 0.01 wt. %. Consequently, an insulating film 22 having the thickness of about 30 nm of an oxide of tantalum nitride (Tao$_x$N$_y$) is formed on the surface of the first metal layer 21. The insulating film 22 includes a first insulating layer 221 having the thickness of 5 to 25 nm and the ratio of nitrization of y=0.7 to 3.0 provided by the oxidation of the surface of the first metal layer 21, and a second insulating layer 222 having the thickness of 25 to 5 nm and the ratio of nitrization of y=0.1 to 0.4 provided by oxidation of the second tantalum nitride layer deposited on the first metal layer 21. The content of nitrogen of the first insulating layer 221 is larger than that of the second insulating layer.

If the signal line 12 has a high resistance, the surface of the signal line 12 may be etched to leave the insulating film 22 only on the projecting portions 12a, and a low resistance film such as chromium may be formed on the signal line 12. Alternatively, a low resistance film to be positioned below the signal line 12 may be patterned in advance. Since the insulating film 22 is formed of an oxide of tantalum nitride which is colorless and transparent, the insulating film 22 does not cause any problem if it covers the first metal layer 21, or even if it further covers the insulating substrate 11 or the pixel electrode 13. The insulating film 22 should preferably be formed by anodization. However, other method of oxidation, such as thermal oxidation, plasma oxidation or injection of oxygen ions may be used.

Thereafter, a metal film of chromium or the like is formed by deposition to cover the insulating layer 22, and by patterning the metal film by photolithography or the like, a second metal layer 23 is formed. By partially stacking the second metal layer 23 and the pixel electrode 13 which has been or will be formed on the insulating substrate 11, electrical contact is provided therebetween. The first insulating liquid crystal retaining film 14 is formed by printing or the like on the substrate 11 to cover the signal lines 12, the MIM elements 2 and the pixel electrode 13. When 90° twist nematic mode is to be used, the surface of the liquid crystal retaining film 14 is subjected to rubbing for orientation.

Figure 2:
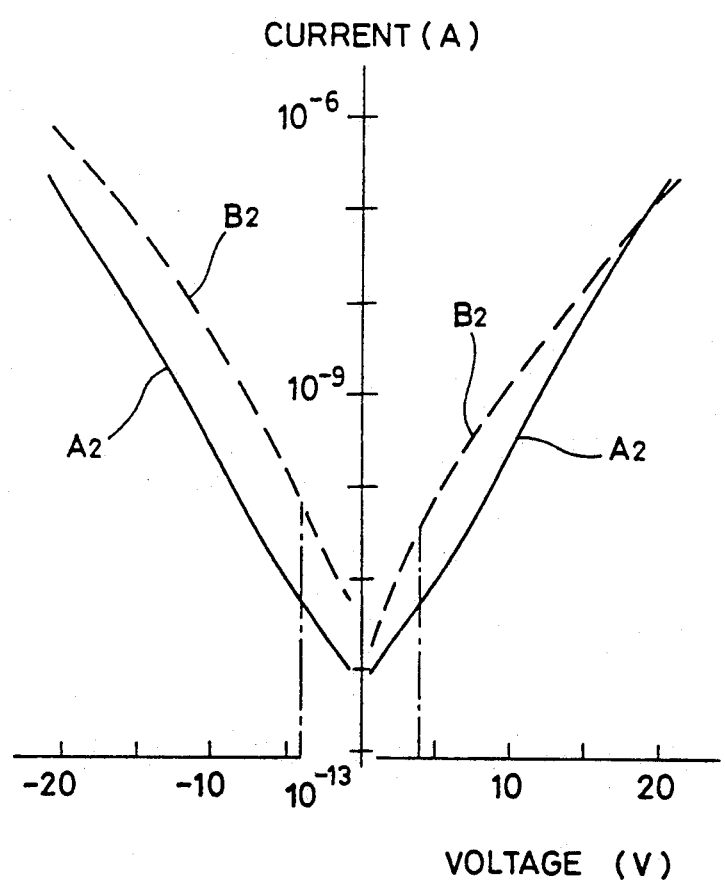
FIG. 2 is a graph showing the I-V characteristic of the MIM element.

Referring to FIG. 2, the I-V characteristic of the MIM element 2 provided in this manner will be described. In this graph, the abscissa represents the voltage (V) applied to the MIM element, while the ordinate represents in amps, in logarithmic scale, the current (I) flowing through the MIM element. The typical I-V characteristic of the MIM element in the above described embodiment is denoted by the curve A2, and the ON current with the ON voltage being 20 V is approximately the same as the current value of a conventional MIM element of tantalum type without nitrogen. However, the MIM element of the present embodiment show OFF current as small as about $10^{-11}$ A or less with the OFF voltage being 4 V. This OFF current of $10^{-11}$ A is much smaller than OFF current value in the conventional MIM element of tantalum type without nitrogen, and it also smaller by 20% to 40% than the OFF current of about 30 to $5 \times 10^{-11}$ A represented by the I-V characteristic curve B2 of the MIM element of tantalum type which includes nitrogen of uniform concentration entirely over the first metal layer and the insulating layer.

The value of β (see Pool-Frenkel's formula (1)) representing inclination of the I-V characteristic curve of FIG. 2 is typically 4.3 in the MIM element of the embodiment exhibiting the characteristic A2. It has a value as high as 4.0 to 5.0 even when variation is taken into account, which is considerably larger than the value 3.0 of the conventional MIM element exhibiting the characteristic B2.

Further, when the polarity of the voltage applied is changed, the value of the OFF current and the value of the ON current do not change even if the polarity is changed in curve A2 of FIG. 2, and the curve A2 is, as a whole, approximately symmetrical with respect to the polarity of the voltage. When the liquid crystal display is driven in the high voltage multiplexed manner by using the MIM element having such I-V characteristic as shown by the curve A2, the time of display could be made longer than when it is driven by using TFTs (Thin Film Transistors).

Figure 3A:
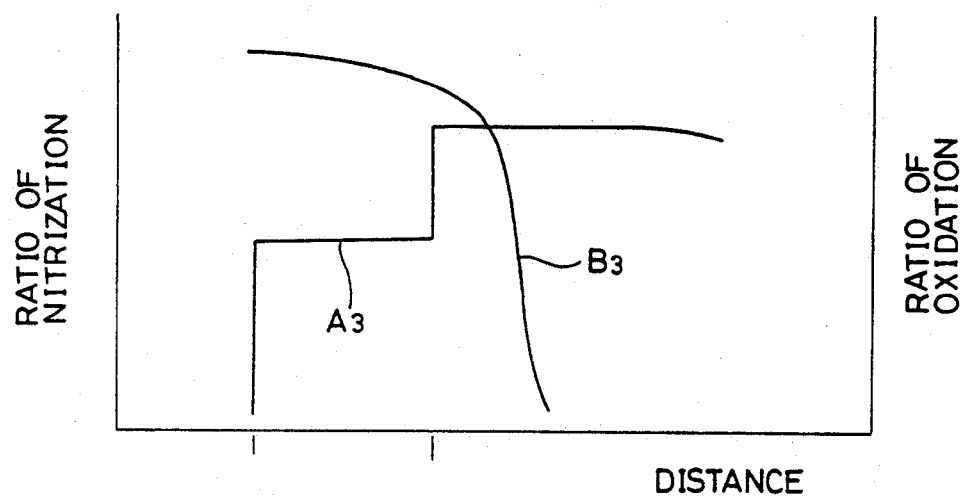
FIG. 3A is a graph showing the ratio of nitrization and the ratio of oxidization of the insulating film in the MIM element shown in FIG. 1B.
Figure 3B:
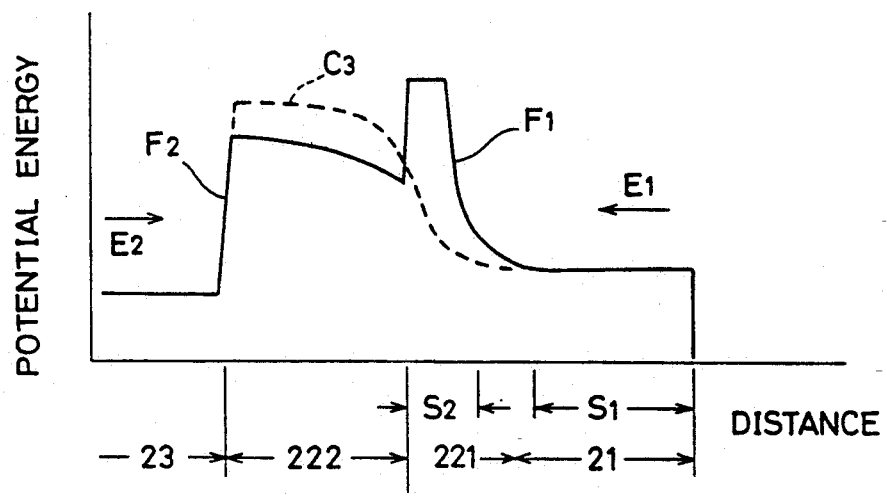
FIG. 3B is a graph showing the energy barrier in the insulating film shown in FIG. 3A.

Referring to FIGS. 3A and 3B, the reason why such I-V characteristic as shown by as the curve A2 of FIG. 2 is obtained will be described. In FIGS. 3A and 3B, the abscissa represents the distance from an interface between the second metal layer 23 and the insulating protective film 22 to the first metal layer 21. In FIG. 3A, two ordinates represent the ratio of nitrization and the ratio of oxidation, respectively, while the ordinate in FIG. 3B shows the height of energy barrier in the insulating film 22. An approximately constant ratio of nitrization can be kept if the flow rate of nitrogen and the like is kept constant while the tantalum nitride layer is being formed. Therefore, a tantalum nitride film having such distribution of nitride concentration as shown by the curve A3 of FIG. 3A can be formed. The insulating film of the oxide of tantalum nitride is formed by oxidation which proceeds from the surface of the tantalum nitride film. Therefore, the ratio of oxidation gradually lowers from the surface of the insulating film to the first metal layer, as shown by the curve B3.

The height of the energy barrier with respect to the electrons in the insulating film is considered to be dependent on the ratio of nitrization and the ratio of oxidation, as shown in FIG. 3B. Although there is little difference, the entire region of the second metal layer 23 and the non-oxidized region S1 of the first metal layer 21 both have low potential energy. However, since different materials are in contact with each other at the interface between the second metal layer 23 and the second insulating layer 222, the potential energy shows abrupt change there. Namely, the second insulating layer 222 has a higher potential energy than the second metal layer 23. However, in the second insulating layer 222, the ratio of oxidation lowers from the surface toward the inside, and therefore the potential energy gradually lowers. At the interface between the second insulating layer 222 and the first insulating layer 221, the first insulating layer 221 has the higher ratio of nitrization than the second insulating layer. In an oxide of tantalum nitride, the resistance value becomes higher as the content of nitrogen increases. Therefore, the first insulating layer 221 has higher potential energy than the second insulating layer 222. However, since the ratio of oxidation rapidly lowers from the surface of the first insulating layer toward the inside of the first metal layer, the first insulating layer 221 is thin, and the potential energy rapidly lowers to be continuous to that of the first metal layer 21.

In the Pool-Frenkel's formula (1) for analyzing the I-V characteristic of the MIM element, the region having the highest potential energy in the insulating film governs the I-V characteristic. More specifically, the value $\beta$ representing the steepness of the I-V characteristic becomes larger in reverse proportion to the square root of the thickness of the insulating layer having the highest potential energy (see formula (3)). In such a graph showing energy as FIG. 3B of the present embodiment, the region S2 of the first insulating layer 221 shows the highest potential energy, and this region S2 is considered to determine the I/V characteristic of the MIM element. In other words, the value $\beta$ increases dependent on the thickness of this region S2 and on the height of the potential energy. The energy barrier S2 is particularly effective for the low OFF voltage as it is thin, and consequently, the value of the OFF current can be made sufficiently small.

The insulating film of the conventional MIM element includes a single insulating layer, and typical distribution of potential energy which is provided stably in the insulating film can be represented by the dotted curve C3 of FIG. 3B. Therefore, when the energy barrier of the insulating film is to be increased, the thickness of the insulating film is also increased, which prevents provision of larger value of $\beta$. On the contrary, if the thickness of the insulating film is to be reduced, the I-V characteristic tends to vary in respective MIM elements.

Assume that a positive or negative voltage is applied to the MIM element. In that case, there will be an electron wave E1 from the low energy region formed of the first metal layer 21 to the first insulating layer 221 caused by the application of the voltage, and an electron wave E2 from the second metal layer 23 to the second insulating layer 222 through the liquid crystal layer. In the present embodiment, since an energy barrier F1 and an energy barrier F2 are provided in the first insulating layer 221 and in the second insulating layer 222, respectively, inclinations of the side surfaces of energy barriers F1 and F2 can be made approximately identical, and therefore the change in the current with respect to the change of polarity of the applied voltage can be made approximately symmetrical.

On the contrary, as to the energy barrier shown by the characteristic curve C3 of the conventional MIM element, the ratio of nitrization of the insulating film is constant and the ratio of oxidation gradually lowers from the surface of the insulating film. Therefore, the inclination of the side surface of the energy barrier is considered to be asymmetrical.

Figure 4:
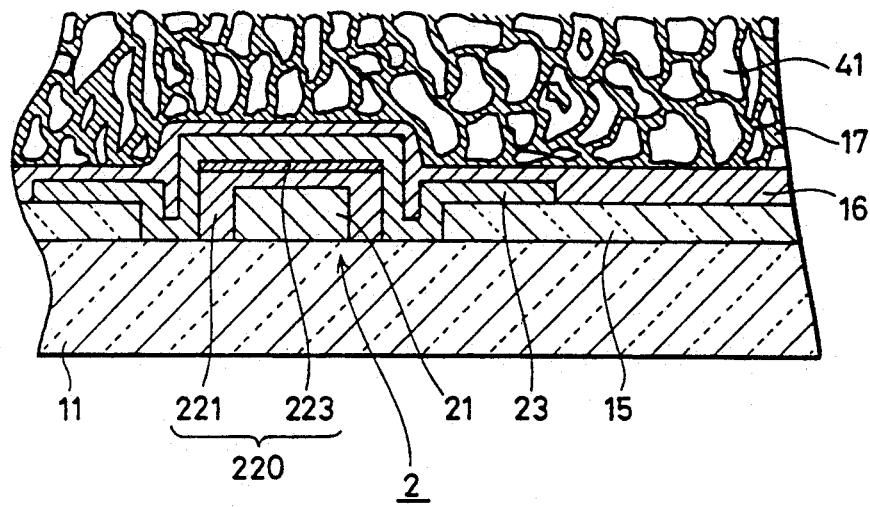
FIG. 4 is a cross section showing a portion of the liquid crystal display according to one embodiment of the present invention.
Figure 5:
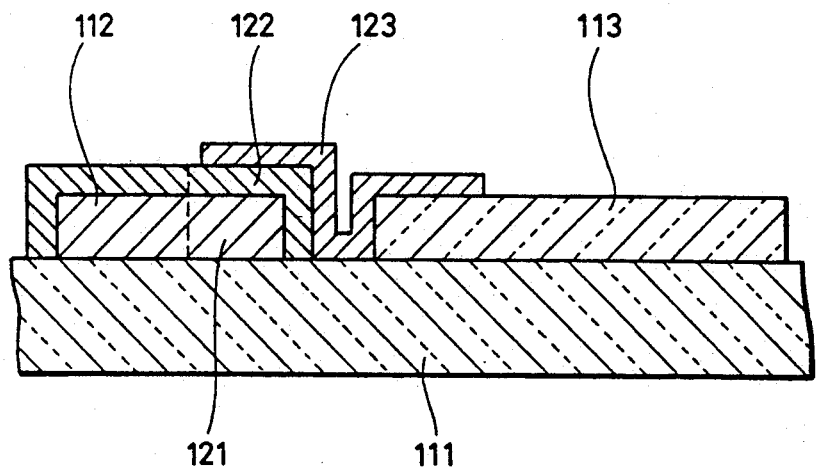
FIG. 5 is a cross section showing a portion of a conventional liquid crystal display.

Referring to FIG. 4, a portion of a liquid crystal display in accordance with another embodiment of the present invention is shown. In FIG. 4, the same reference characters as FIG. 1B show the corresponding portions. In the embodiment of FIG. 1B, the insulating film 22 is provided to cover not only the upper surface but also the side surfaces of the first metal layer 21. However, the MIM element 2 is formed by the portion in which the first metal layer 21, the insulating film 22 and the second metal layer 23 are laminated. Therefore, the characteristic of the MIM element is mostly determined by the area of the upper surface of the first metal layer 21. This is taken into consideration in the embodiment of FIG. 4, in which the MIM element is formed with the second insulating layer 223 provided only above the surface of the first metal layer 21. Further, in the embodiment of FIG. 4, an insulating three-dimensional network 17 is provided on the MIM element 2 and on the pixel electrode 15, and the liquid crystal 41 is filled in the porous cavity thereof. When such a liquid crystal layer 41 is used, an intermediate insulating film 16 formed of organic or inorganic material may be provided below the insulating three-dimensional network 17.

The second insulating layer 223 of the MIM element of FIG. 4 is formed by patterning the second tantalum nitride layer formed by the method described above and thereafter by anodizing the same. Although there is not the second insulating layer 223 between the side surface of the first metal layer 21 and the second metal layer 23, it has little influence to the electric characteristic of the MIM element, since the first insulating layer 221 is thick and the area of the side surface of the first metal layer 21 is small.

When we compare the MIM elements of FIGS. 1B and FIG. 4, the effective area of the MIM element of the embodiment shown in FIG. 4 is 5 $\mu$m $\times$ 5 $\mu$m $=$ 25 $\mu$m$^2$, when the width of the first metal layer 21 and the second metal layer 23 are 5 $\mu$m, respectively. In the embodiment shown in FIG. 1B, the effective area will be 5 $\mu$m $\times$ 5 $\mu$m $+$ 2 $\times$ 5 $\mu$m $\times$ 250 nm $=$ 27.5 $\mu$m$^2$, when the thickness of the first metal layer 21 is 250 nm, since the side surfaces of the first metal layer 21 is included in the effective area of the MIM element. Therefore, in the MIM element of the embodiment shown in FIG. 4, the value of $\beta$ is lower by about 10% as compared with the embodiment of FIG. 1B. However, the OFF current is reduced a little, as preferred in the embodiment of FIG.

4, and approximately the same symmetrical I-V characteristic as in the embodiment of FIG. 1B can be provided.

In liquid crystal display in accordance with the above described two embodiments, 232000 to 816000 pixel electrodes and MIM elements were arranged in an effective display screen of 12 inch, and they were driven in the highly multiplexed manner. The I-V characteristic was steep enough to prevent any influence to the display contrast when the OFF voltage changed by more than 2.5 V in 90° twist nematic mode, and further, display of high quality having the contrast ratio of 30:1 to 80:1 could be provided at a high multiplex driving of 1/100 duty cycle to 1/700 duty cycle.

As described above, in the present invention, the insulating film in the MIM element can be uniformly formed thick as a whole. The I-V characteristic of the MIM element is considered to be dependent on one thin layer having high energy barrier in a plurality of films of oxides of tantalum nitride, and therefore, the value of $\beta$ is increased and the I-V characteristic becomes steeper. As a result, the resistance of the MIM element against the small OFF voltage is increased, and the OFF current can be made sufficiently small. In the insulating film of the MIM element of the present invention, the inclination of the energy barrier at portions where the first and second metal layers contact the insulating film can be made approximately the same by controlling the ratio of oxidation and the ratio of nitrization. Therefore, when the voltage having the same absolute value and reverse direction are applied, approximately the same current can flow in the MIM element, and the I-V characteristic can be made approximately symmetrical, eliminating practical problem. Therefore, if the liquid crystal layer which, unlike the light emitting diode, does not have the diode characteristic itself is driven in the high multiplexed manner, degradation of liquid crystal layer or flickering of the display screen are not caused by the alternating signals in the OFF voltage period, and therefore a liquid crystal display having high display contrast and longer life can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A liquid crystal display comprising:
   a first insulating substrate;
   a plurality of signal lines formed on said first substrate;
   a plurality of MIM elements connected to said signal lines;
   pixel electrodes connected to said MIM elements
   a second insulating substrate;
   a plurality of opposing electrodes formed on said second substrate and facing said pixel electrodes; and
   a liquid crystal layer sandwiched between said first and second substrate; wherein
   said MIM elements each include
   a first metal layer including a portion of said signal line,
   a first insulating layer formed on said first metal layer and including an oxide of tantalum nitride ($TaO_xN_y$) with a first ratio of nitrization,
   a second insulating layer formed on said first insulating layer and including an oxide of tantalum nitride ($TaO_xN_y$) with a second ratio of nitrization which is lower than said first ratio, and
   a second metal layer formed on said second insulating layer.

2. The liquid crystal display according to claim 1, wherein
   said first metal layer is formed of tantalum nitride of $TaN_y$.

3. The liquid crystal display according to claim 2, wherein
   said first metal layer has a ratio of nitrization of $y = 0.7$ to $3.0$.

4. The liquid crystal display according to claim 3, wherein
   said first metal layer has a thickness of 100 to 500 nm and the width of 2 to 50 $\mu$m.

5. The liquid crystal display according to claim 1, wherein
   said first insulating layer has said first ratio of nitrization of $y = 0.7$ to $3.0$ and a thickness of 5 to 25 nm, and said second insulating layer has said second ratio of nitrization of $y = 0.1$ to $0.4$ and a thickness of 25 to 5 nm.

6. The liquid crystal display according to claim 1, wherein
   said signal lines are formed of tantalum nitride, and having the thickness of 100 to 500 nm and the width of 3 to 50 $\mu$m.

7. The liquid crystal display according to claim 1, wherein
   said second metal layer is formed of a metal selected from the group consisting of chromium, copper and aluminum.

8. The liquid crystal display according to claim 7, wherein
   said second metal layer has a thickness of 10 to 200 nm and a width of 3 to 10 $\mu$m.

9. The liquid crystal display according to claim 1, wherein
   said first and second substrates are formed of glass.

10. The liquid crystal display according to claim 1, wherein
    said liquid crystal layer is of a twist nematic type.

11. The liquid crystal display according to claim 1, wherein
    said liquid crystal layer is held in an insulative three-dimensional network sandwiched between said first and second substrate.

12. The liquid crystal display according to claim 1, wherein
    said first insulating layer has said first ratio of nitrization of $y = 0.7$ to $3.0$ and said second insulating layer has said second ratio of nitrization of $y = 0.1$ to $0.4$.

13. The liquid crystal display according to claim 1, wherein
    said first insulating layer has said first ratio of nitrization of y and said second insulating layer has said second ratio of nitrization of y.

14. A MIM element used in a liquid crystal display, comprising:
    an insulating substrate;
    a first metal layer formed on said substrate;
    a first insulating layer including an oxide of tantalum nitride with a first ratio of nitrization formed on said first metal layer;

a second insulating layer formed on the first insulating layer and including an oxide of tantalum nitride with a second ratio of nitrization lower than said first ratio, and a second metal layer formed on the second insulating layer.

15. The MIM element according to claim 14, wherein said first metal layer is formed of tantalum nitride.

16. An MIM element used in a liquid crystal display, comprising:

a first metal layer of tantalum nitride formed on an insulating substrate;

a second tantalum nitride layer on and lying over said first tantalum nitride layer;

an insulating film formed by oxidizing a surface of said first tantalum nitride layer and the second tantalum nitride layer; and a second metal layer formed on said insulating film.

17. The MIM element according to claim 16, wherein said oxidation is carried out by anodization.

18. The MIM element according to claim 16, wherein said first and second tantalum nitride layers are formed by sputtering.

19. The MIM element according to claim 16 wherein the nitrization ratio of the portion of the insulating film formed by oxidizing the surface of said first tantalum nitride layer is greater than that of the portion formed by oxidizing said second tantalum nitride layer.

* * * * *